(12) United States Patent
Arumskog et al.

(10) Patent No.: US 10,471,523 B2
(45) Date of Patent: Nov. 12, 2019

(54) ROTATING TOOL

(71) Applicant: Sumitomo Electric Industries, Ltd., Osaka-shi (JP)

(72) Inventors: Paer Christoffer Arumskog, Itami (JP); Yoshiharu Utsumi, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 2 days.

(21) Appl. No.: 15/552,644

(22) PCT Filed: Feb. 15, 2016

(86) PCT No.: PCT/JP2016/054295
§ 371 (c)(1),
(2) Date: Aug. 22, 2017

(87) PCT Pub. No.: WO2016/136520
PCT Pub. Date: Sep. 1, 2016

(65) Prior Publication Data
US 2018/0029145 A1   Feb. 1, 2018

(30) Foreign Application Priority Data
Feb. 23, 2015 (JP) .................... 2015-033136

(51) Int. Cl.
*B23C 5/00* (2006.01)
*B23C 5/16* (2006.01)
(Continued)

(52) U.S. Cl.
CPC ............ *B23C 5/16* (2013.01); *B23B 51/00* (2013.01); *B23B 51/02* (2013.01); *B23C 5/10* (2013.01);
(Continued)

(58) Field of Classification Search
CPC ......... Y10T 428/265; Y10T 428/24975; B23B 2228/10; B23B 2228/105
See application file for complete search history.

(56) References Cited

U.S. PATENT DOCUMENTS 5,467,670 A * 11/1995 Alverio .................. B23C 5/10
76/104.1
6,688,817 B2 * 2/2004 Borschert ............... B23B 51/02
408/144
(Continued)

FOREIGN PATENT DOCUMENTS

| JP | S61-288914 A | 12/1986 |
|---|---|---|
| JP | 2005-022071 A | 1/2005 |
| JP | 2012-036506 A | 2/2012 |

OTHER PUBLICATIONS

Shimamura et al., Machining of Difficult-To-Machine Materials by PVD Coated Tool, Journal of the Japan Society for Abrasive Technology, vol. 57, No. 8 (2013), 536-541.
Lundin et al., An introduction to thin film processing using high-power impulse magnetron sputtering, J. Mater. Res., vol. 27, No. 5 (2012), 780-792.

*Primary Examiner* — Willmon Fridie, Jr.
(74) *Attorney, Agent, or Firm* — Baker Botts L.L.P.; Michael A. Sartori (57) ABSTRACT

It is an object to provide a rotating tool having an excellent wear resistance. The rotating tool includes: a base member including a cutting edge portion and a flute portion; and a coating film that coats a surface of the base member, a ratio B/A of a film thickness B of the coating film coating a surface of the flute portion to a film thickness A of the coating film coating a surface of the cutting edge portion being not less than 0.8.

6 Claims, 4 Drawing Sheets

(51) Int. Cl.
  B23B 51/00    (2006.01)
  B23C 5/10     (2006.01)
  B23B 51/02    (2006.01)
  C23C 14/06    (2006.01)
  C23C 14/34    (2006.01)
  C23C 14/35    (2006.01)
  C23C 30/00    (2006.01)
  B23D 77/00    (2006.01)

(52) U.S. Cl.
  CPC .............. *B23D 77/00* (2013.01); *C23C 14/06* (2013.01); *C23C 14/0641* (2013.01); *C23C 14/3485* (2013.01); *C23C 14/35* (2013.01); *C23C 30/005* (2013.01); *B23B 2228/105* (2013.01); *B23C 2210/40* (2013.01); *B23C 2224/00* (2013.01); *B23C 2228/10* (2013.01)

(56) References Cited

U.S. PATENT DOCUMENTS

| | | | | |
|---|---|---|---|---|
| 8,043,035 | B2* | 10/2011 | Åstrand | B23B 51/02 |
| | | | | 407/119 |
| 9,017,809 | B2* | 4/2015 | Sottke | C23C 16/308 |
| | | | | 428/325 |
| 9,452,478 | B2* | 9/2016 | Igarashi | C23C 16/36 |
| 2003/0198525 | A1* | 10/2003 | Iwamoto | B23C 5/1009 |
| | | | | 407/54 |
| 2007/0218313 | A1* | 9/2007 | Okada | B23B 51/06 |
| | | | | 428/698 |

* cited by examiner

ROTATING TOOL

TECHNICAL FIELD

The present invention relates to a rotating tool including a base member and a coating film formed on the base member.

BACKGROUND ART

As a tool, there has been known a tool in which a hard coating film such as TiAlN is provided on a surface of a hard base member such as WC based cemented carbide. By providing such a coating film on the surface of the base member, the wear resistance of the base member can be improved, thereby achieving an extended life of the tool.

For example, each of Japanese Patent Laying-Open No. 2012-36506 (Patent Document 1) and Journal of the Japan Society for Abrasive Technology, Vol. 57, No. 8 (2013), 536-541 (Non-Patent Document 1) discloses a tool in which a coating film is provided on a surface of a base member by an arc ion plating (AIP) method. Moreover, as another method of producing a coating film, a magnetron sputtering (MS) method has been known.

CITATION LIST

Patent Document

PTD 1: Japanese Patent Laying-Open No. 2012-36506

Non Patent Document

NPD 1: Machining of Difficult-To-Machine Materials by PVD Coated Tool, Shimamura et al., Journal of the Japan Society for Abrasive Technology Vol. 57, No. 8 (2013), 536-541

NPD 2: An introduction to thin film processing using high-power impulse magnetron sputtering, J. Mater. Res., vol. 27, No. 5 (2012), 780-792

SUMMARY OF INVENTION

Technical Problem

However, in the rotating tool including the coating film formed by each of the above-described conventional techniques, a degree of improvement in wear resistance by the inclusion of the coating film may be insufficient.

In view of the above problem, the present disclosure has an object to provide a rotating tool having an excellent wear resistance.

Solution to Problem

A rotating tool according to one embodiment of the present invention includes: a base member including a cutting edge portion and a flute portion; and a coating film that coats a surface of the base member, a ratio B/A of a film thickness B of the coating film coating a surface of the flute portion to a film thickness A of the coating film coating a surface of the cutting edge portion being not less than 0.8.

Advantageous Effects of Invention

According to the description above, a rotating tool having an excellent wear resistance can be provided.

DESCRIPTION OF EMBODIMENTS

Description of Embodiments of the Present Invention

First, embodiments of the present invention are listed and described.

As a result of study to solve the above-described problem, the present inventors found that: in the conventional rotating tool, the film thickness of the coating film formed on the surface of the flute portion is remarkably smaller than the film thickness of the coating film formed on the surface of the cutting edge portion, thus resulting in a decreased wear resistance of the rotating tool. Based on this knowledge, the present inventors considered that there is a problem in a conventional method of forming a coating film such as the AIP method or the MS method, and conducted diligent study by paying attention to a High Power Impulse Magnetron Sputtering (HiPIMS) method described in J. Mater. Res., vol. 27, No. 5 (2012), 780-792 (Non-Patent Document 2) as an alternative to the foregoing formation method. As a result, a rotating tool having an excellent wear resistance has been completed.

[1] A rotating tool according to one embodiment of the present invention includes: a base member including a cutting edge portion and a flute portion; and a coating film that coats a surface of the base member, a ratio B/A of a film thickness B of the coating film coating a surface of the flute portion to a film thickness A of the coating film coating a surface of the cutting edge portion being not less than 0.8.

According to the rotating tool, wear of the coating film coating the surface of the flute portion can be suppressed, thereby attaining an excellent wear resistance.

[2] The rotating tool is an end mill. Conventionally, in an end mill, the above-described ratio tends to be particularly small. However, according to the above-described rotating tool, the ratio is larger than that of the conventional one, thereby attaining an excellent wear resistance.

[3] The rotating tool is a drill. Conventionally, in a drill, the above-described ratio tends to be particularly small. However, according to the above-described rotating tool, the ratio is larger than that of the conventional one, thereby attaining an excellent wear resistance.

[4] In the rotating tool, the ratio B/A is not less than 1. Accordingly, the wear resistance can be more excellent.

[5] In the rotating tool, the film thickness A is not less than 0.1 μm and not more than 10 μm. Accordingly, the wear resistance can be more excellent.

[6] In the rotating tool, the film thickness A is not less than 2.0 μm and not more than 6.0 μm. Accordingly, the wear resistance can be more excellent.

[7] In the rotating tool, a material of the coating film is not less than one compound composed of: at least one element selected from a group consisting of a group 4 element, a group 5 element, a group 6 element in a periodic table, aluminum, and silicon; and at least one element selected from a group consisting of boron, carbon, nitrogen, and oxygen. Accordingly, the rotating tool can include a coating film having a high hardness.

DETAILS OF EMBODIMENTS OF THE PRESENT INVENTION

Although the following describes one embodiment (hereinafter, referred to as "the present embodiment") of the present invention in detail, the present embodiment is not limited thereto.

<Rotating Tool>

Figure 1:
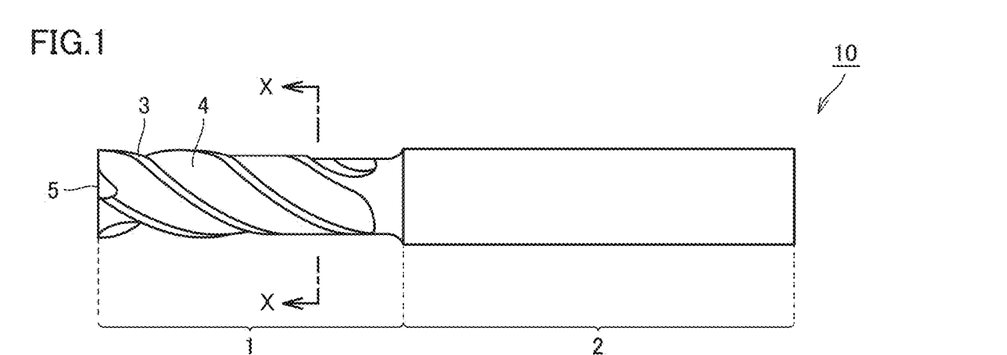
FIG. 1 is a schematic plan view showing an exemplary rotating tool according to one embodiment of the present embodiment.
Figure 2:
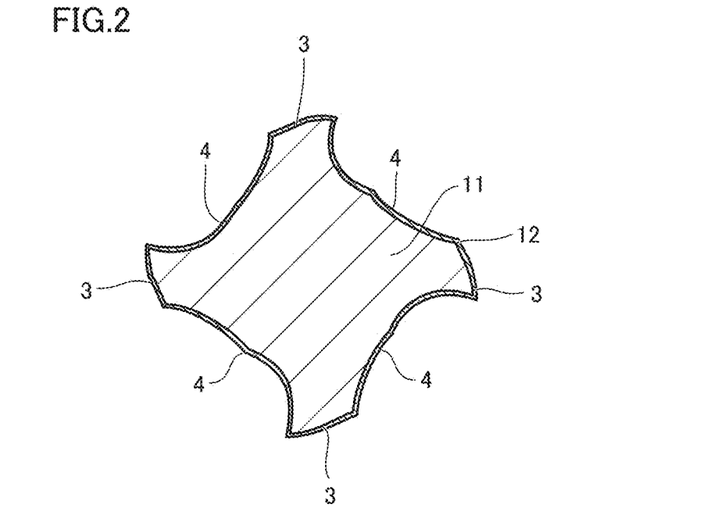
FIG. 2 is a cross sectional view taken along an X-X line shown in FIG. 1.

FIG. 1 is a schematic plan view showing an exemplary rotating tool according to the present embodiment. FIG. 2 is a cross sectional view taken along an X-X line shown in FIG. 1. In the present embodiment, an end mill with four cutting edges will be illustrated.

With reference to FIG. 1 and FIG. 2, a rotating tool 10 includes: a base member 11 serving as a main body of rotating tool 10; and a coating film 12 that coats a surface of base member 11. The whole surface of base member 11 included in rotating tool 10 may be coated with coating film 12, or a part of base member 11 may be coated therewith. For example, a surface of base member 11 constituting a shank 2 may not be coated and only a surface of the base member constituting a blade head 1 may be coated with coating film 12.

In the present embodiment, an end mill will be illustrated as rotating tool 10; however, examples of rotating tool 10 include a drill in addition to the end mill. Moreover, in addition to those above, examples of rotating tool 10 include a rooter, a reamer, and the like as long as rotating tool 10 includes: base member 11 having a cutting edge portion for cutting a workpiece at least in contact with the workpiece, and a flute portion for bringing swarf to outside; and coating film 12. Particularly, rotating tool 10 of the present embodiment can be suitably used as a rotating tool for high precision machining.

(Base Member)

Base member 11 serves as the main body of rotating tool 10 and has a shape corresponding to that of rotating tool 10. Base member 11 includes blade head 1 and shank 2. Blade head 1 includes peripheral cutting edge portions 3, flute portions 4, and an end cutting edge portion 5. Each peripheral cutting edge portion 3 and end cutting edge portion 5 are regions for cutting the workpiece, and each flute portion 4 is a region for bringing swarf produced by the cutting to outside. Particularly, peripheral cutting edge portion 3 includes a cutting edge portion (not shown), which is a portion having no relief angle relative to the workpiece. The cutting edge portion is a portion to be in contact with the workpiece during cutting.

Figure 3:
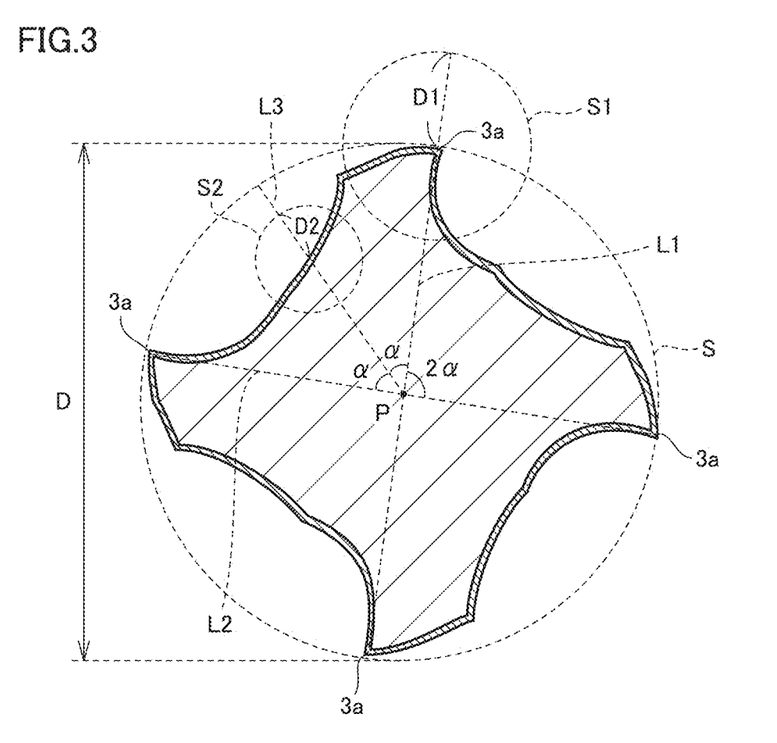
FIG. 3 is a schematic view for illustrating each region of a peripheral cutting edge portion and a flute portion.

Here, in the present specification, each of peripheral cutting edge portion 3 and flute portion 4 is determined as follows. With reference to FIG. 3, a circle S is a hypothetical circle that includes a cross section of blade head 1 inside and that is drawn by connecting cutting edge tips 3a. Circle S has a diameter D. It should be noted that each of cutting edge tips 3a is a portion serving as a starting point via which the workpiece is cut.

Peripheral cutting edge portion 3: A circle S1 is a hypothetical circle that has a central point corresponding to a contact point between cutting edge tip 3a and circle S and that has a radius D1 of $^2/_{10}$D. In the outer circumference of base member 11, peripheral cutting edge portion 3 represents a region located within (and on) hypothetical circle S1.

Flute portion 4: Lines L1 and L2 are hypothetical lines that connect facing cutting edge tips 3a to central point P of circle S. A line L3 is a hypothetical line that equally divides an angle 2a formed by line L1 and line L2. A circle S2 is a hypothetical circle that has a central point corresponding to a contact point between line L3 and the outer circumference of base member 11 and that has a radius D2 of $^1/_{10}$D. In the outer circumference of base member 11, flute portion 4 represents a region located within (and on) hypothetical circle S2.

As the material of base member 11, a material conventionally known for a base member 11 of a rotating tool can be used without a particular limitation. Examples thereof include tungsten carbide (WC) based cemented carbide, cermet, a high-speed steel, ceramics, a cubic boron nitride sintered material, a diamond sintered material, and the like. It should be noted that base member 11 may be formed in one piece or may be formed in a combination of a plurality of components.

(Coating Film)

Coating film 12 is configured to coat the entire surface of base member 11 or a portion of the surface. Moreover, coating film 12 may have a single layer structure constituted of one layer, or may have a multi-layer structure constituted of two or more layers. In the present embodiment, a ratio B/A of a film thickness B of coating film 12 coating a surface of flute portion 4 to a film thickness A of coating film 12 coating a surface of cutting edge portion 6 is not less than 0.8. Accordingly, rotating tool 10 can be excellent in wear resistance.

The following describes a reason why rotating tool 10 of the present embodiment is excellent in wear resistance in comparison with a conventional rotating tool. An expected wear resistance of a rotating tool from a design of the rotating tool is found from not only a physical property of the base member but also a physical property of the coating film provided on the surface of the base member. However, the conventional rotating tool tends to be unable to exhibit a wear resistance comparable to the wear resistance expected from the design. Regarding this, the present inventors have found the following knowledge: in the conventional rotating tool, ratio B/A of film thickness B of the coating film formed on the surface of the flute portion to film thickness A of the coating film formed on the surface of the cutting edge portion is too small, i.e., about not more than 0.5, with the result that the wear resistance of the flute portion is lower than the wear resistance expected from the design and accordingly the wear resistance of the rotating tool is insufficient.

Such a too small ratio is related with a fact that the coating film of the conventional rotating tool is produced by the MS method or the AIP method. Specifically, in the MS method, since an ionization ratio of atoms serving as a target in plasma is too low, the ions cannot be sufficiently drawn to the flute portion by a substrate bias. In the AIP method, the ionization ratio is sufficient; however, pressure in the chamber needs to be high in order to reduce the number of metal droplets generated from the target. Accordingly, the pressure in the chamber becomes too high, with the result that a mean free path of the ions tends to be too short. When the mean free path of the ions is short, the ions are likely to be dispersed, thus making it difficult to draw the ions to the flute portion. Accordingly, in each of these methods, a coating film having a uniform film thickness cannot be formed on a surface of a base member for a rotating tool having a shape more complicated than those of other tools, thus resulting in a small film thickness B of the coating film on the flute portion located in the complicated portion of the base member.

When film thickness B is small, wear of the flute portion is promoted faster than expected. This leads to a decreased smoothness of the flute portion to result in a decreased dischargeability for swarf. Accordingly, a cutting resistance is increased. When the cutting resistance is increased, wear at the cutting edge portion is also promoted faster than expected, with the result that the wear resistance of the rotating tool becomes insufficient. Moreover, if the coating film is formed to have a sufficiently large film thickness B at the flute portion, film thickness A thereof at the cutting edge portion becomes too large. Accordingly, adhesion between the coating film and the base member is decreased, thereby causing a decreased wear resistance.

On the other hand, rotating tool 10 of the present embodiment includes coating film 12 formed using the HiPIMS method instead of the MS method and the AIP method. In the HiPIMS method, large electric power is applied to the target at a short pulse, thereby achieving a high ionization ratio. Moreover, since the HiPIMS method is one type of sputtering, pressure in the chamber can be low.

By using the HiPIMS method, coating film 12 having the uniform film thickness is formed on the surface of base member 11, whereby the above-described ratio B/A can indicate a high value to be not less than 0.8. Therefore, the above-described problem in the conventional rotating tool can be solved by rotating tool 10 of the present embodiment. Hence, rotating tool 10 of the present embodiment can have a higher wear resistance than that of the conventional rotating tool. Further, the high wear resistance leads to not only a long life but also an improved cutting precision, thereby obtaining a good surface condition such as surface roughness in a workpiece.

Moreover, when the film thickness of the coating film needs to be small as in a high precision machining rotating tool, film thickness B in the flute portion becomes too small in the conventional rotating tool, with the result that the tool life tends to be very short. According to rotating tool 10 of the present embodiment, however, this can be overcome. Therefore, rotating tool 10 of the present embodiment is suitable as a high precision machining rotating tool.

Film thickness A and film thickness B of coating film 12 can be measured by cutting rotating tool 10 in a longitudinal direction (lateral direction in FIG. 1) and observing the cross section using a scanning electron microscope (SEM). In the present specification, ratio B/A is determined in the following manner: film thicknesses A of arbitrary points (four points in total in the present embodiment) of the respective cutting edges are measured, film thicknesses B of arbitrary points (four points in total in the present embodiment) of the respective flute portions are measured, and the total value of all the values of measured film thicknesses B are divided by the total value of all the values of measured film thicknesses A. It should be noted that with reference to FIG. 3, for example, when rotating tool 10 has four cutting edges and has a blade head with a diameter (diameter of circle S in FIG. 3) of about 10 mm, it is preferable that: deviation of the arbitrary point of each of the cutting edges from the center (cutting edge tip 3a) of circle S1 is not more than 100 μm; and deviation of the arbitrary point of each of the flute portions from the center of circle S2 is not more than 100 μm.

In coating film 12, ratio B/A is preferably not less than 1. In this case, rotating tool 10 can be more excellent in wear resistance. Moreover, from results of Examples described later (see Table 1), it is confirmed that rotating tool 10 is more excellent in wear resistance when ratio B/A is more than 1.0, specifically, is not less than 1.01. Moreover, it is also confirmed that ratio B/A is preferably not more than 4.15. Further, it is also confirmed that: the wear resistance is excellent particularly when ratio B/A is 1.05 to 3.90; and the wear resistance is excellent more remarkably when ratio B/A is 1.22 to 3.90.

Moreover, in coating film 12, film thickness A is preferably not less than 0.1 μm and not more than 10 μm (hereinafter, such a notation will be also simply expressed as "0.1 to 10 μm"). When film thickness A is less than 0.1 μm, the functional characteristics (inclusive of the improved wear resistance) resulting from the inclusion of coating film 12 may be unlikely to be exhibited sufficiently. When film thickness A is more than 10 μm, the adhesion between base member 11 and coating film 12 tends to be decreased. Film thickness A is more preferably 2.0 to 6.0 μm.

As the material of coating film 12, a material conventionally known for a coating film 12 of a rotating tool can be used without a particular limitation. Particularly, coating film 12 is preferably composed of not less than one compound including: at least one element selected from a group consisting of a group 4 element (Ti, Zr, Hf, or the like), a group 5 element (V, Nb, Ta, or the like), a group 6 element (Cr, Mo, W, or the like) in the periodic table, aluminum (Al), and silicon (Si); and at least one element selected from a group consisting of boron (B), carbon (C), nitrogen (N), and oxygen (O).

Among these, TiAlN, TiN, CrN, AlCrN, AlCrSiN, TiAlSiN, TiSiN, TiCN, TiAlON, and TiAlBNO are preferable. TiAlN, TiN, CrN, AlCrN, AlCrSiN, TiAlSiN, and TiCN are more preferable. In this case, a coating film 12 having a high hardness and more suitable for rotating tool 10 can be provided.

It should be noted that when a compound is indicated by a chemical formula such as TiAlN in the present specification, it is assumed that the compound includes ones with all the conventionally known atomic ratios when the atomic ratio of the compound is not particularly limited, and is not necessarily limited to ones with atomic ratios falling within the stoichiometric range.

<Production Method>

Figure 4:
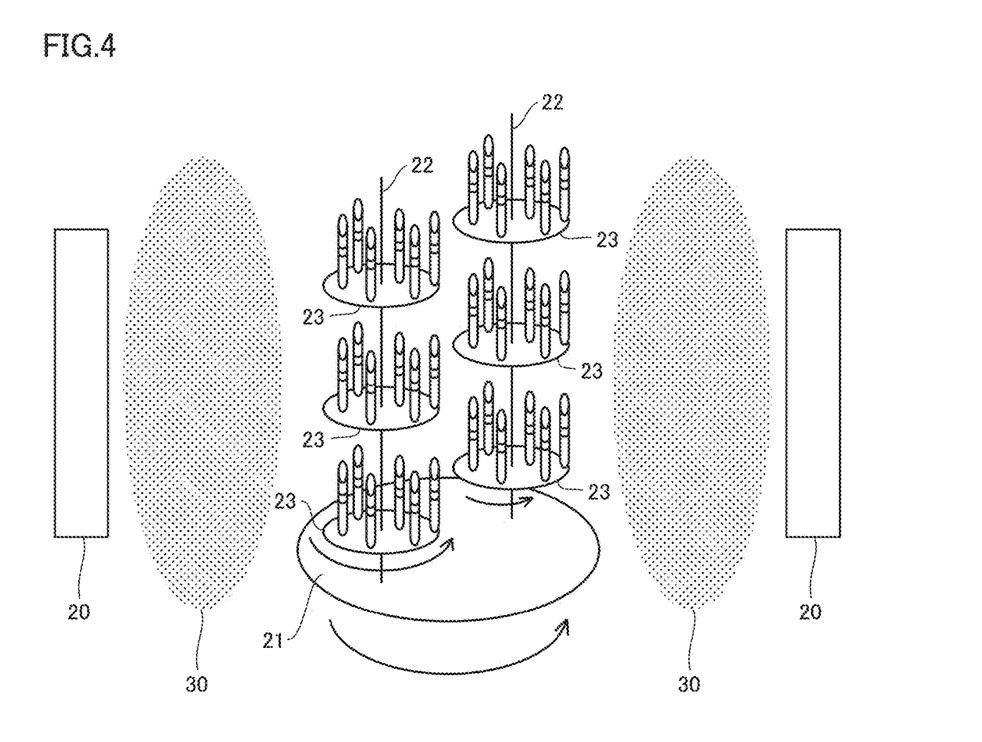
FIG. 4 is a schematic view showing a state of arrangement of a base member in a chamber during formation of a coating film.

Rotating tool 10 of the present embodiment can be produced by using the HiPIMS method to form coating film 12 on the surface of base member 11. With reference to FIG. 4, the following describes a case where a coating film composed of TiAlN is formed as an exemplary coating film 12.

FIG. 4 shows a state of arrangement of the base member within a chamber during formation of the coating film. With reference to FIG. 4, targets 20 each serving as a source material of coating film 12 are disposed at the side walls of the chamber (not shown). It should be noted that FIG. 4 shows two targets 20 but the number of targets 20 is not particularly limited. For example, when coating film 12 composed of TiAlN is to be formed, a plurality of Ti targets and a plurality of Al targets can be disposed in the chamber.

At the center between the plurality of targets disposed in the chamber, a turntable 21 is disposed. On turntable 21, a plurality of placement tables (substrates) 23 are disposed at/along two rotation shafts 22. On each placement table 23, a plurality of base members 11 are placed. It should be noted that the number of rotation shafts 22 is not limited to that shown in FIG. 4 and may be two or more. In this case, the number of turntables 21 and placement tables 23 can also be increased in response to an increase in the number of the rotation shafts.

Placement table 23 is electrically connected to a negative electrode of a bias power supply. The bias supply has a positive electrode that is connected to a ground and that is electrically connected to the chamber (not shown). Moreover, a negative electrode of a short pulse power supply is connected to the target. The short pulse power supply has a positive electrode connected to a ground (not shown).

During the formation of coating film 12, inert gas and nitrogen gas are introduced into the chamber in vacuum and large electric power is applied to target 20 at a short pulse. Accordingly, plasma 30 is generated in the chamber. Then, ions are collided with target 20, whereby metal atoms and metal ions are brought out from target 20 to adhere to the surface of base member 11 together with the nitrogen atoms. It should be noted that turntable 21 and rotation shafts 22 are rotated in the respective directions of arrows shown in the figure. On this occasion, coating film 12 in which ratio B/A is not less than 0.8 can be formed by setting film formation conditions as follows.

Film Formation Conditions:
Pulse width (pulse time): 100 μs to 10 ms
Pulse power density: not less than 1.5 kW/cm$^2$
Pulse average power: not less than 4 kW
Bias voltage: not more than 80 V
Pressure in chamber: not more than 1 Pa
Film formation time: 4 to 650 minutes.

Regarding the film formation conditions above, the pulse width is more preferably 100 μs to 1 ms, and the bias is preferably not more than 60 V. Moreover, a film formation condition mode is more preferably set at a transition mode, and a partial pressure of the reactive gas (nitrogen gas in the present embodiment) is preferably in consideration of hysteresis loss.

EXAMPLES

While the present invention will be described in more detail with reference to Examples, the present invention is not limited thereto. In each of samples No. 1 to No. 44 and A to G, a coating film was formed on a base member by the HiPIMS method. In each of samples No. 45 to No. 61, a coating film was formed on a base member by the AIP method.

<Samples No. 1 to No. 13 and A to F>
(Film Formation Process)

First, the base member was prepared. The base member of each of samples No. 1 to No. 8, No. 10 to No. 13 and A to F was composed of cemented carbide provided by Sumitomo Electric Industries, and had a shape "SSEHVL4160-R10" (with a diameter of 16 mm and four cutting edges). The base member of sample No. 9 was composed of cemented carbide provided by Sumitomo Electric Industries, and had a shape "SSEHVL4100-R10" (with a diameter of 10 mm and four cutting edges).

The prepared base member was placed on a placement table (substrate) (see FIG. 4) in a chamber of an HiPIMS apparatus. In the chamber, an alloy target of titanium (50 atom %) and aluminum (50 atom %) was placed as a target. Then, the film formation process was performed under the following film formation conditions while introducing argon (Ar) gas and nitrogen (N$_2$) gas. Regarding the respective samples, film formation conditions other than the pulse width were the same. The pulse width of each sample is shown in Table 1. It should be noted that the film formation time was set at a time appropriate to attain a coating film having an intended film thickness.

Film Formation Conditions:
Pulse width (pulse time): 25 μs to 50 ms (changed for each sample; see Table 1)
Pulse power density: 1.5 kW/cm$^2$
Pulse average power: 6 kW
Bias voltage: 30 to 60 V (changed for each sample; see Table 1)
Pressure in chamber: 0.60 to 0.70 Pa
Partial pressure of argon gas: 0.4 Pa
Mode: transition mode It should be noted that the "pulse power density" is a value obtained by dividing an "average power within a pulse" by an "area of a racetrack in a target surface".

TABLE 1

| Sample No. | Production Method | Type of Coating Film | Tool | Film Formation Conditions | | Film Thickness of Coating Film | | | Test 1 | Test 2 | | Test 3 | |
|---|---|---|---|---|---|---|---|---|---|---|---|---|---|
| | | | | Pulse Width (ms) | Bias Voltage (−V) | Film Thickness A (μm) | Film Thickness B (μm) | Ratio (B/A) | Cutting Distance (m) | Ra (μm) | Feed Force (N) | Ra (μm) | Feed Force (N) |
| 1 | HiPIMS | Ti$_{50}$Al$_{50}$N | End Mill | 0.025 | 60 | 2.67 | 1.71 | 0.64 | 5.0 | — | — | — | — |
| 2 | HiPIMS | Ti$_{50}$Al$_{50}$N | End Mill | 0.05 | 60 | 2.78 | 1.97 | 0.71 | 5.5 | — | — | — | — |
| 3 | HiPIMS | Ti$_{50}$Al$_{50}$N | End Mill | 0.1 | 60 | 2.91 | 2.68 | 0.92 | 7.5 | — | — | — | — |
| 4 | HiPIMS | Ti$_{50}$Al$_{50}$N | End Mill | 0.25 | 60 | 2.99 | 3.02 | 1.01 | 9.0 | — | — | — | — |
| 5 | HiPIMS | Ti$_{50}$Al$_{50}$N | End Mill | 0.5 | 60 | 3.11 | 3.02 | 0.97 | 8.5 | — | — | — | — |
| 6 | HiPIMS | Ti$_{50}$Al$_{50}$N | End Mill | 0.75 | 60 | 3.20 | 3.36 | 1.05 | 10.0 | — | — | — | — |
| 7 | HiPIMS | Ti$_{50}$Al$_{50}$N | End Mill | 1 | 60 | 3.02 | 2.69 | 0.89 | 8.0 | — | — | — | — |
| 8 | HiPIMS | Ti$_{50}$Al$_{50}$N | End Mill | 2.5 | 60 | 2.35 | 1.94 | 0.82 | — | 0.35 | 550 | — | — |
| 9 | HiPIMS | Ti$_{50}$Al$_{50}$N | End Mill | 2.5 | 60 | 2.13 | 2.24 | 1.05 | — | — | — | 0.31 | 155 |
| 10 | HiPIMS | Ti$_{50}$Al$_{50}$N | End Mill | 5 | 60 | 3.24 | 2.72 | 0.84 | 7.0 | — | — | — | — |
| 11 | HiPIMS | Ti$_{50}$Al$_{50}$N | End Mill | 10 | 60 | 3.12 | 2.53 | 0.81 | 8.0 | — | — | — | — |
| 12 | HiPIMS | Ti$_{50}$Al$_{50}$N | End Mill | 20 | 60 | 3.38 | 2.60 | 0.77 | — | — | — | — | — |
| 13 | HiPIMS | Ti$_{50}$Al$_{50}$N | End Mill | 50 | 60 | 2.98 | 1.79 | 0.60 | — | — | — | — | — |
| A | HiPIMS | Ti$_{50}$Al$_{50}$N | End Mill | 0.6 | 60 | 3.02 | 3.68 | 1.22 | 11.5 | — | — | — | — |
| B | HiPIMS | Ti$_{50}$Al$_{50}$N | End Mill | 0.625 | 50 | 3.28 | 4.92 | 1.50 | 12 | — | — | — | — |
| C | HiPIMS | Ti$_{50}$Al$_{50}$N | End Mill | 0.65 | 40 | 2.95 | 6.11 | 2.07 | 12.5 | — | — | — | — |
| D | HiPIMS | Ti$_{50}$Al$_{50}$N | End Mill | 0.675 | 30 | 2.89 | 7.46 | 2.58 | 13.5 | — | — | — | — |
| E | HiPIMS | Ti$_{50}$Al$_{50}$N | End Mill | 0.7 | 30 | 2.81 | 10.96 | 3.90 | 11.0 | — | — | — | — |
| F | HiPIMS | Ti$_{50}$Al$_{50}$N | End Mill | 0.725 | 30 | 2.77 | 11.50 | 4.15 | 8.5 | — | — | — | — |

(Measurement of Film Thickness of Coating Film)

For each of the rotating tools (end mills) of samples No. 1 to No. 13 and A to F obtained by the above-described film formation process, film thickness A of the coating film coating the surface of the cutting edge portion and film thickness B of the coating film coating the surface of the flute portion were measured in the coating film thereof. Then, ratio B/A was determined.

Figure 5:
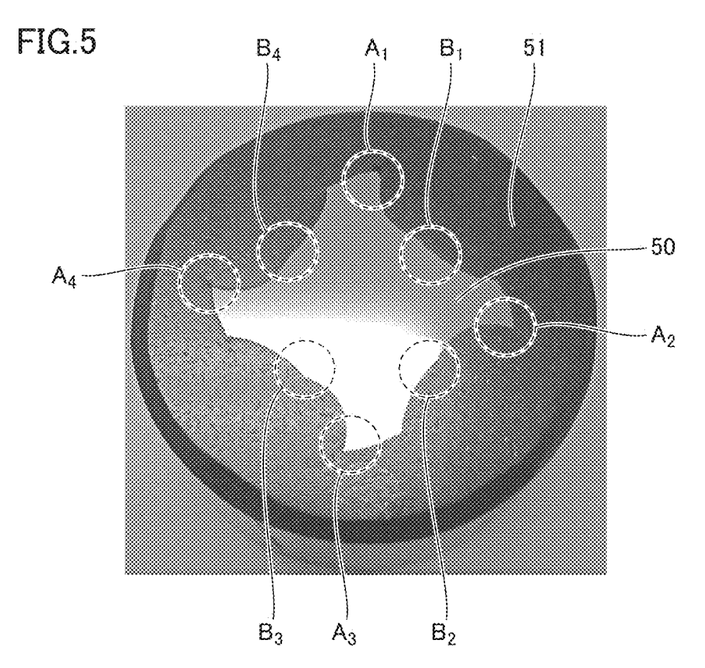
FIG. 5 illustrates a method of measuring a film thickness.

Specifically, first, a cutting machine including a diamond rotating blade was used to partially cut the cutting edge portion of the rotating tool, thereby obtaining a cut piece 50. Next, as shown in FIG. 5, obtained cut piece 50 was embedded in a resin 51 and a cross section of cut piece 50 (surface of cut piece 50 observed in FIG. 5) was observed by an SEM. Film thicknesses A of the coating film coating the surfaces of cutting edge portions $A_1$ to $A_4$ were measured, and film thicknesses B of the coating film coating the surfaces of flute portions $B_1$ to $B_4$ were measured. From the respective average values of the film thicknesses A, B, the ratio therebetween was determined.

Specifically, the film thickness of the coating film coating each of the surfaces of cutting edge portions $A_1$ to $A_4$ was measured at one arbitrary point in the outer circumference of the blade head with a deviation of not more than 100 μm from the cutting edge tip. The film thickness of the coating film coating each of the surfaces of flute portions $B_1$ to $B_4$ was measured at one arbitrary point with a deviation of not more than 100 μm (see FIG. 3) from a position at which line L4 is in contact with the outer circumference of blade head 1. Then, the value of the total of the four film thicknesses measured at the flute portions was divided by the value of the total of the four film thicknesses measured at the cutting edge portions, thereby obtaining ratio B/A. Results thereof are shown in Table 1.

(Cutting Test 1)

Each of produced samples No. 1 to No. 7, No. 10, No. 11 and A to F was subjected to a cutting test (flute processing life test) 1 to evaluate a tool life. Cutting conditions were set as described below. A cutting distance was measured until the tool life was reached, specifically, until the maximum wear of the cutting edge portion became 0.1 mm. Results thereof are shown in Table 1. In Table 1, a longer cutting distance indicates a longer tool life.

Cutting Conditions:

Workpiece: stainless steel (SUS304)

Amount of cut ap: 4.8 mm

Rotational speed: 1200/min

Feed speed: 130 mm/min

Air blow: performed

Here, the "amount of cut ap" represents an amount of cut in the axial direction of the rotating tool.

(Cutting Test 2)

Produced sample No. 8 was subjected to a cutting test (processed side surface quality test) 2 to evaluate tool performance. Cutting conditions were set as described below. A surface roughness (Ra) of a workpiece after the cutting test and feed force (N) during cutting were measured. Results thereof are shown in Table 1. In Table 1, a smaller Ra indicates a more smooth surface of the workpiece, and a smaller feed force (N) indicates a smaller resistance between the workpiece and the rotating tool.

Cutting Conditions:

Workpiece: stainless steel (SUS304)

Cutting speed: 30 m/min

Feed speed (fz): 0.083 mm/blade

Amount of cut ap: 16.0 mm

Amount of cut ae: 1.6 mm

Air blow: performed

Here, the "amount of cut ap" represents an amount of cut in the axial direction of the rotating tool, and the "amount of cut ae" represents an amount of cut in the radial direction of the rotating tool.

(Cutting Test 3)

Produced sample No. 9 was subjected to a cutting test (processed side surface quality test) 3 to evaluate tool performance. Cutting conditions were set as described below. A surface roughness (Ra) of the workpiece after the cutting test and feed force (N) during cutting were measured. Results thereof are shown in Table 1. In Table 1, a smaller Ra indicates a more smooth surface of the workpiece, and a smaller feed force (N) indicates a smaller resistance between the workpiece and the rotating tool.

Cutting Conditions:

Workpiece: stainless steel (SUS304)

Cutting speed: 50 m/min

Feed speed (fz): 0.050 mm/blade

Amount of cut ap: 10.0 mm

Amount of cut ae: 1.0 mm

Air blow: performed

Here, the "amount of cut ap" represents an amount of cut in the axial direction of the rotating tool, and the "amount of cut ae" represents an amount of cut in the radial direction of the rotating tool.

As shown in Table 1, regarding cutting test 1, a high tool life was confirmed in each of samples No. 3 to No. 7, No. 10, No. 11 and A to F in each of which ratio B/A was not less than 0.8. Moreover, regarding cutting tests 2 and 3, in each of samples No. 8 and No. 9 in each of which ratio B/A was not less than 0.8, it was confirmed that the surface of the workpiece after the cutting process was sufficiently smooth and the cutting resistance was also sufficiently low. Accordingly, it was found that the rotating tool in each of samples No. 3 to No. 11 and A to F was excellent in wear resistance. The wear resistance was apparently high as compared with below-described samples No. 45 to No. 61 (rotating tools including coating films formed by a conventional film formation process).

<Samples No. 14 to No. 24>

Rotating tools (end mills) of samples No. 14 to No. 16 were obtained in the same manner as that for sample No. 7 except that the pulse power density was changed as shown in Table 2. Rotating tools (end mills) of samples No. 17 to No. 20 were obtained in the same manner as that for sample No. 7 except that the pulse average power was changed as shown in Table 2. Rotating tools (end mills) of samples No. 21 to No. 24 were obtained in the same manner as that for sample No. 7 except that the bias voltage was changed as shown in Table 2. The film thickness of the coating film of each of the obtained rotating tools of samples No. 14 to No. 24 was measured by the same method as that described above, and ratio B/A was determined. Results thereof are shown in Table 2.

TABLE 2

| Sample No. | Production Method | Type of Coating Film | Tool | Film Formation Conditions | | | Film Thickness of Coating Film | | Ratio (B/A) |
|---|---|---|---|---|---|---|---|---|---|
| | | | | Pulse Power Density (kW/cm$^2$) | Pulse Average Power (kW) | Bias Voltage (−V) | Film Thickness A (μm) | Film Thickness B (μm) | |
| 7  | HiPIMS | Ti$_{50}$Al$_{50}$N | End mill | 1.5 | 6  | 60  | 3.02 | 2.69 | 0.89 |
| 14 | HiPIMS | Ti$_{50}$Al$_{50}$N | End Mill | 0.5 | 6  | 60  | 3.14 | 2.07 | 0.66 |
| 15 | HiPIMS | Ti$_{50}$Al$_{50}$N | End Mill | 1   | 6  | 60  | 3.00 | 2.16 | 0.72 |
| 16 | HiPIMS | Ti$_{50}$Al$_{50}$N | End Mill | 2   | 6  | 60  | 2.78 | 2.42 | 0.87 |
| 17 | HiPIMS | Ti$_{50}$Al$_{50}$N | End Mill | 1.5 | 2  | 60  | 2.54 | 1.83 | 0.72 |
| 18 | HiPIMS | Ti$_{50}$Al$_{50}$N | End Mill | 1.5 | 4  | 60  | 2.79 | 2.34 | 0.84 |
| 19 | HiPIMS | Ti$_{50}$Al$_{50}$N | End Mill | 1.5 | 8  | 60  | 2.90 | 2.73 | 0.94 |
| 20 | HiPIMS | Ti$_{50}$Al$_{50}$N | End Mill | 1.5 | 10 | 60  | 3.21 | 2.89 | 0.90 |
| 21 | HiPIMS | Ti$_{50}$Al$_{50}$N | End Mill | 1.5 | 6  | 20  | 2.98 | 2.59 | 0.87 |
| 22 | HiPIMS | Ti$_{50}$Al$_{50}$N | End Mill | 1.5 | 6  | 40  | 2.81 | 2.53 | 0.90 |
| 23 | HiPIMS | Ti$_{50}$Al$_{50}$N | End Mill | 1.5 | 6  | 80  | 3.11 | 2.52 | 0.81 |
| 24 | HiPIMS | Ti$_{50}$Al$_{50}$N | End Mill | 1.5 | 6  | 100 | 2.94 | 2.15 | 0.73 |

As shown in Table 2, in order to obtain ratio B/A of the coating film to be not less than 0.8, it was found preferable to set the pulse power density to be not less than 1.5 kW/cm$^2$, set the pulse average power to be not less than 4 kW, and set the bias voltage to be not more than 80 V.

<Samples No. 25 to No. 31>

Rotating tools (end mills) of samples No. 25 to No. 31 were obtained in the same manner as that for sample No. 7 except that the film formation time was changed as shown in Table 3. The film thickness of the coating film of each of the obtained rotating tools of samples No. 25 to No. 31 was measured by the same method as that described above, and ratio B/A was determined. Then, cutting test 1 was performed using each of the rotating tools of samples No. 25 to No. 31 to measure a cutting distance until the tool life was reached. Results thereof are shown in Table 3.

than 0.07 μm. The same applies to a case where film thickness A of the coating film is not more than 10.8 μm. Moreover, it was confirmed that the cutting distance of each of samples No. 7, No. 28, and No. 29 was particularly long. Based on this fact, it was found that the wear resistance is particularly excellent when film thickness A of the coating film is 2.08 to 5.71 μm.

<Samples No. 32 to No. 41 and G>

Rotating tools (end mills) of samples No. 32 to No. 41 and G were obtained in the same manner as that for sample No. 7 except that the composition of the coating film was changed as shown in Table 4. It should be noted that in order to change the composition of the coating film as shown in Table 4, a type of target in the chamber and a type of gas to

TABLE 3

| Sample No. | Production Method | Type of Coating Film | Tool | Film Formation Conditions Film Formation Time (Minute) | Film Thickness of Coating Film | | Ratio (B/A) | Test 1 Cutting Distance (m) |
|---|---|---|---|---|---|---|---|---|
| | | | | | Film Thickness A (μm) | Film Thickness B (μm) | | |
| 7  | HiPIMS | Ti$_{50}$Al$_{50}$N | End Mill | 180 | 3.02  | 2.69 | 0.89 | 8.0 |
| 25 | HiPIMS | Ti$_{50}$Al$_{50}$N | End Mill | 4   | 0.07  | 0.06 | 0.90 | 3.5 |
| 26 | HiPIMS | Ti$_{50}$Al$_{50}$N | End Mill | 8   | 0.12  | 0.10 | 0.85 | 6.0 |
| 27 | HiPIMS | Ti$_{50}$Al$_{50}$N | End Mill | 70  | 1.15  | 1.00 | 0.87 | 7.0 |
| 28 | HiPIMS | Ti$_{50}$Al$_{50}$N | End Mill | 125 | 2.08  | 1.83 | 0.88 | 8.0 |
| 29 | HiPIMS | Ti$_{50}$Al$_{50}$N | End Mill | 340 | 5.71  | 4.68 | 0.82 | 9.0 |
| 30 | HiPIMS | Ti$_{50}$Al$_{50}$N | End Mill | 500 | 8.30  | 7.47 | 0.90 | 7.5 |
| 31 | HiPIMS | Ti$_{50}$Al$_{50}$N | End Mill | 650 | 10.80 | 9.07 | 0.84 | 5.5 |

As shown in Table 3, it was confirmed that ratio B/A became not less than 0.8 when film thickness A of the coating film was not less than 0.07 μm. In other words, it was found that ratio B/A can be readily controlled to be not less than 0.8 when film thickness A of the coating film is not less be introduced were changed appropriately. The film thickness of the coating film of each of the obtained rotating tools of samples No. 32 to No. 41 and G was measured by the same method as that described above, and ratio B/A was determined. Results thereof are shown in Table 4.

TABLE 4

| Sample No. | Production Method | Type of Coating Film | Tool | Film Formation Conditions | | Film Thickness of Coating Film | | Ratio (B/A) |
|---|---|---|---|---|---|---|---|---|
| | | | | Pulse Width (ms) | Bias Voltage (−V) | Film Thickness A (μm) | Film Thickness B (μm) | |
| 32 | HiPIMS | TiN | End Mill | 1 | 60 | 2.90 | 2.90 | 1.00 |
| 33 | HiPIMS | CrN | End Mill | 1 | 60 | 2.71 | 2.63 | 0.97 |
| 34 | HiPIMS | $Al_{70}Cr_{30}N$ | End Mill | 1 | 60 | 3.01 | 2.56 | 0.85 |
| 35 | HiPIMS | $Ti_{80}Si_{20}N$ | End Mill | 1 | 60 | 2.95 | 2.57 | 0.87 |
| 36 | HiPIMS | $Al_{45}Ti_{45}Si_{10}N$ | End Mill | 1 | 40 | 2.76 | 2.51 | 0.91 |
| 37 | HiPIMS | $Al_{45}Cr_{45}Si_{10}N$ | End Mill | 1 | 40 | 3.24 | 2.98 | 0.92 |
| 38 | HiPIMS | TiCN | End Mill | 1 | 40 | 2.87 | 2.38 | 0.83 |
| 39 | HiPIMS | $Ti_{50}Al_{50}ON$ | End Mill | 1 | 40 | 2.60 | 2.34 | 0.90 |
| 40 | HiPIMS | $Ti_{50}Al_{50}BN$ | End Mill | 1 | 40 | 2.56 | 2.33 | 0.91 |
| 41 | HiPIMS | $Ti_{50}Al_{50}BNO$ | End Mill | 1 | 40 | 2.61 | 2.27 | 0.87 |
| G | HiPIMS | $Al_{45}Ti_{45}Si_{10}N$ | End Mill | 0.7 | 35 | 2.69 | 3.69 | 1.37 |

As shown in Table 4, it was confirmed that ratio B/A became not less than 0.8 also in each of samples No. 32 to No. 41 and G.

<Samples No. 42 to No. 44>

Rotating tools (drills) of samples No. 42 to No. 44 were obtained in the same manner as that for sample No. 7 except that: a base member was used which was composed of cemented carbide provided by Sumitomo Electric Industries and had a shape "MDW0800HGS5" (with a diameter of 8 mm and L/D=5); and the film formation conditions (the pulse time and the pulse power density) were changed as shown in Table 5. The film thickness of the coating film of each of the obtained rotating tools of samples No. 42 to No. 44 was measured by the same method as that described above, and ratio B/A was determined. Results thereof are shown in Table 5.

(Cutting Test 4)

Each of produced samples No. 42 to No. 44 was subjected to a cutting test (drilling test) 4 to evaluate a tool life. Cutting conditions were set as described below. Thrust (N) and torque (N) during the cutting were measured. Results thereof are shown in Table 5. In Table 5, larger thrust (N) and torque (N) indicate a larger cutting resistance.

Cutting Conditions:
Workpiece: carbon steel (S50C)
Cutting speed (rotational speed): 90 m/min
Feed amount: 0.25 mm/rev
Amount of cut: 40 mm
Wet cutting.

was smaller than those of samples No. 43 and No. 44 and therefore the wear resistance was excellent.

<Samples No. 45 to No. 61>

First, a base member was prepared. The base member of each of samples No. 45 to No. 49, No. 51 to No. 53 and No. 55 to No. 61 was composed of cemented carbide provided by Sumitomo Electric Industries, and had a shape "SSE-HVL4160-R10" (with a diameter of 16 mm and four cutting edges). The base member of sample No. 50 was composed of cemented carbide provided by Sumitomo Electric Industries, and had a shape "SSEHVL4100-R10" (with a diameter of 10 mm and four cutting edges). The base member of sample No. 54 was composed of cemented carbide provided by Sumitomo Electric Industries, and had a shape "MDW0800HGS5" (with a diameter of 8 mm and L/D=5).

The prepared base member of sample No. 45 was placed on a placement table (substrate) in a chamber of an AIP apparatus. In the chamber, an alloy target of titanium (50 atom %) and aluminum (50 atom %) was placed as a target. Then, the film formation process was performed under the following film formation conditions while introducing argon (Ar) gas and nitrogen ($N_2$) gas. It should be noted that the film formation time was set at a time appropriate to attain a coating film having an intended film thickness.

Film Formation Conditions:
Arc current: 150 A
Bias voltage: 40 V
Pressure in chamber: 4.5 Pa.

TABLE 5

| Sample No. | Production Method | Type of Coating Film | Tool | Film Formation Conditions | | Film Thickness of Coating Film | | Ratio (B/A) | Test 4 | |
|---|---|---|---|---|---|---|---|---|---|---|
| | | | | Pulse Width (ms) | Pulse Power Density (kW/cm²) | Film Thickness A (μm) | Film Thickness B (μm) | | Thrust (N) | Torque (N) |
| 42 | HiPIMS | $Ti_{50}Al_{50}N$ | Drill | 1 | 1.5 | 2.46 | 2.12 | 0.86 | 1150 | 450 |
| 43 | HiPIMS | $Ti_{50}Al_{50}N$ | Drill | 1 | 0.5 | 2.73 | 1.83 | 0.67 | 1350 | 600 |
| 44 | HiPIMS | $Ti_{50}Al_{50}N$ | Drill | 50 | 1.5 | 2.58 | 1.60 | 0.62 | 1400 | 650 |

As shown in Table 5, as with the end mills (samples No. 1 to No. 41 and A to G), it was confirmed that ratio B/A of the coating film included in the drill became not less than 0.8 when the predetermined film formation conditions were satisfied. Moreover, in sample No. 42 in which ratio B/A was not less than 0.8, it was confirmed that the cutting resistance The film thickness of the coating film of the obtained rotating tool (end mill) of sample No. 45 was measured by the same method as that described above, and ratio B/A was determined. Moreover, cutting test 1 described above was performed using the rotating tool of sample No. 45 to measure a cutting distance until the tool life was reached. Results thereof are shown in Table 6.

TABLE 6

| Sample No. | Production Method | Type of Coating Film | Tool | Film Formation Conditions | | Film Thickness of Coating Film | | | Test 1 | Test 2 | | Test 3 | | Test 4 | |
| | | | | Arc Current (A) | Bias Voltage (−V) | Film Thickness A (μm) | Film Thickness B (μm) | Ratio (B/A) | Cutting Distance (m) | Ra (μm) | Feed Force (N) | Ra (μm) | Feed Force (N) | Thrust (N) | Torque (N) |
|---|---|---|---|---|---|---|---|---|---|---|---|---|---|---|---|
| 45 | AIP Method | $Ti_{50}Al_{50}N$ | End Mill | 150 | 40 | 3.21 | 2.05 | 0.64 | — | — | — | — | — | — | — |
| 46 | AIP Method | $Ti_{50}Al_{50}N$ | End Mill | 150 | 60 | 3.07 | 1.93 | 0.63 | — | — | — | — | — | — | — |
| 47 | AIP Method | $Ti_{50}Al_{50}N$ | End Mill | 150 | 80 | 2.96 | 1.98 | 0.67 | 5.0 | — | — | — | — | — | — |
| 48 | AIP Method | $Ti_{50}Al_{50}N$ | End Mill | 150 | 100 | 3.10 | 2.17 | 0.70 | 6.0 | — | — | — | — | — | — |
| 49 | AIP Method | $Ti_{50}Al_{50}N$ | End Mill | 150 | 100 | 2.90 | 1.77 | 0.61 | — | 0.82 | 650 | — | — | — | — |
| 50 | AIP Method | $Ti_{50}Al_{50}N$ | End Mill | 150 | 100 | 2.26 | 1.49 | 0.66 | — | — | — | 0.35 | 165 | — | — |
| 51 | AIP Method | $Ti_{50}Al_{50}N$ | End Mill | 150 | 150 | 2.85 | 1.71 | 0.60 | 5.5 | — | — | — | — | — | — |
| 52 | AIP Method | $Ti_{50}Al_{50}N$ | End Mill | 150 | 200 | 2.87 | 1.78 | 0.62 | — | — | — | — | — | — | — |
| 53 | AIP Method | $Ti_{50}Al_{50}N$ | End Mill | 150 | 100 | 2.80 | 1.48 | 0.53 | — | — | — | — | — | — | — |
| 54 | AIP Method | $Ti_{50}Al_{50}N$ | Drill | 100 | 100 | 2.68 | 1.82 | 0.68 | — | — | — | — | — | 1500 | 750 |
| 55 | AIP Method | TiN | End Mill | 150 | 80 | 2.90 | 1.91 | 0.66 | — | — | — | — | — | — | — |
| 56 | AIP Method | CrN | End Mill | 150 | 80 | 2.93 | 1.90 | 0.65 | — | — | — | — | — | — | — |
| 57 | AIP Method | $Al_{70}Cr_{30}N$ | End Mill | 150 | 80 | 2.87 | 1.81 | 0.63 | — | — | — | — | — | — | — |
| 58 | AIP Method | $Ti_{80}Si_{20}N$ | End Mill | 150 | 80 | 3.15 | 1.83 | 0.58 | — | — | — | — | — | — | — |
| 59 | AIP Method | $Al_{45}Ti_{45}Si_{10}N$ | End Mill | 150 | 80 | 3.07 | 1.75 | 0.57 | — | — | — | — | — | — | — |
| 60 | AIP Method | $Al_{45}Cr_{45}Si_{10}N$ | End Mill | 150 | 80 | 2.88 | 1.81 | 0.63 | — | — | — | — | — | — | — |
| 61 | AIP Method | TiCN | End Mill | 150 | 80 | 2.76 | 1.68 | 0.61 | — | — | — | — | — | — | — |

Regarding samples No. 46 to No. 54, rotating tools (end mills or drill) were obtained in the same manner as that for sample No. 45 except that the arc current and/or the bias voltage were changed as shown in Table 6. Rotating tools (end mills) of samples No. 55 to No. 61 were obtained in the same manner as that for sample No. 45 except that the composition of the coating film and the bias voltage were changed as shown in Table 6. The film thickness of the coating film of each of the obtained rotating tools of samples No. 46 to No. 61 was measured by the same method as that described above, and ratio B/A was determined. Results thereof are shown in Table 6.

As shown in Table 6, in the coating film formed by the AIP method, it was confirmed that ratio B/A was less than 0.8, i.e., was not more than 0.7. Moreover, samples No. 47 to No. 51 and No. 54 were subjected to one of cutting tests 1 to 4, but had a wear resistance inferior to those of the rotating tools in each of which ratio B/A was not less than 0.8.

The embodiments and examples disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

1: blade head; 2: shank; 3: peripheral cutting edge portion; 4: flute portion; 5: end cutting edge portion; 10: rotating tool; 11: base member; 12: coating film; 20: target; 21: turntable; 22: rotating shaft; 23: placement table; 30: plasma; 50: cut piece; 51: resin.

The invention claimed is:

1. A rotating tool comprising:
   a base member including a cutting edge portion and a flute portion; and
   a coating film that coats a surface of the base member,
   a ratio B/A of a film thickness B of the coating film coating a surface of the flute portion to a film thickness A of the coating film coating a surface of the cutting edge portion being not less than 0.8,
   wherein the film thickness A is not less than 0.1 μm and not more than 10 μm.

2. The rotating tool according to claim 1, wherein the rotating tool is an end mill.

3. The rotating tool according to claim 1, wherein the rotating tool is a drill.

4. The rotating tool according to claim 1, wherein the ratio B/A is not less than 1.

5. The rotating tool according to claim 1, wherein the film thickness A is not less than 2.0 μm and not more than 6.0 μm.

6. The rotating tool according to claim 1, wherein a material of the coating film is not less than one compound composed of: at least one element selected from a group consisting of a group 4 element, a group 5 element, a group 6 element in a periodic table, aluminum, and silicon; and at least one element selected from a group consisting of boron, carbon, nitrogen, and oxygen.

* * * * *